United States Patent
Edwards et al.

[11] Patent Number: 5,924,482
[45] Date of Patent: Jul. 20, 1999

[54] MULTI-MODE, TWO-PHASE COOLING MODULE

[75] Inventors: Michael Ray Edwards, Cary; Garron Koch Morris, Evanston; Kurt Arthur Estes, Lake Zurich; Martin Pais, Arlington Heights, all of Ill.

[73] Assignee: Motorola, Inc., Schaumburg, Ill.

[21] Appl. No.: 08/960,395

[22] Filed: Oct. 29, 1997

[51] Int. Cl.$^6$ ........................... F28D 15/00
[52] U.S. Cl. ............... 165/104.33; 165/104.21; 165/104.25; 165/104.31; 165/908; 361/700
[58] Field of Search ............... 165/104.33, 80.4, 165/104.28, 104.25, 104.31, 104.22, 104.21, 908, 911, 104.26, 104.34, 104.27; 361/700; 257/715

[56] References Cited

U.S. PATENT DOCUMENTS

| | | | |
|---|---|---|---|
| 2,875,263 | 2/1959 | Narbut | 165/104.33 X |
| 3,581,811 | 6/1971 | Loebe | 165/104.25 X |
| 3,950,947 | 4/1976 | Dirne et al. | 165/104.14 X |
| 4,186,559 | 2/1980 | Decker | 165/104.26 X |
| 4,352,392 | 10/1982 | Eastman | 165/104.25 |
| 4,498,118 | 2/1985 | Bell | 165/908 X |
| 4,949,164 | 8/1990 | Ohashi et al. | 165/104.33 X |
| 4,967,829 | 11/1990 | Albers et al. | 165/908 X |
| 5,316,075 | 5/1994 | Quon et al. | 165/104.33 X |
| 5,325,913 | 7/1994 | Altoz | 165/911 X |
| 5,349,831 | 9/1994 | Daikoku et al. | 165/908 X |
| 5,566,751 | 10/1996 | Anderson et al. | 165/104.26 X |
| 5,613,552 | 3/1997 | Osakabe et al. | 165/104.33 X |

FOREIGN PATENT DOCUMENTS

| | | | |
|---|---|---|---|
| 464768 | 3/1975 | U.S.S.R. | 165/104.25 |
| 0646160 | 2/1979 | U.S.S.R. | 165/908 |
| 073122 | 4/1980 | U.S.S.R. | 165/908 |

OTHER PUBLICATIONS

A.H. Johnson, Diaphragm Cooling For Devices, IBM Technical Disclosure Bulletin, vol. 20, No. 8, Jan. 1978, p. 3121.

*Primary Examiner*—Christopher Atkinson
*Attorney, Agent, or Firm*—Heather L. Creps

[57] ABSTRACT

A multi-mode, two-phase cooling module (10) comprises a first housing portion (20), a second housing portion (30), and a third housing portion (40). Cooling liquid (22) is held in first housing portion (20), and one or more electronic components (24) are mounted onto an external surface of first housing portion (20) for being pool cooled. The second housing portion (30) has one or more spray nozzles (32) secured to one of the internal surfaces, and one or more electronic components (34) mounted onto one of the external surfaces in a position opposite spray nozzles (32). The third housing portion (40) has one or more condensers (42) on the internal surfaces, and one or more heat sinks (44) on the external surfaces. One or more electric fans (46), piezo-electronic fans, or spray nozzles (48) may be provided adjacent to internal surfaces of the condensers (42). The cooling module (10) is made of a thermally conductive material.

13 Claims, 1 Drawing Sheet

MULTI-MODE, TWO-PHASE COOLING MODULE

FIELD OF THE INVENTION

The present invention relates generally to a cooling module for electronic components, and, more particularly, to a multi-mode, two-phase cooling module that allows for the collocation of high-power and low-power electronic components.

BACKGROUND OF THE INVENTION

Recently, with an increase in component density due to advances in electronic packaging techniques of integrated circuit (IC) elements, the density of heat generation in electronic equipment has greatly increased. As a result, the heat dissipation requirements within advanced electronic equipment have become increasingly more severe.

Air-cooled systems are commonly used to cool electronic equipment. Now, efforts to shrink electronic assemblies have placed multiple high heat flux parts within close proximity to each other, exceeding the capacity of present air-cooled technology.

Single-phase liquid cooled systems are also commonly used for cooling electronic components. Liquid cooling requires external condensing coils and/or significant plumbing requirements. Thus, liquid cooled systems are comparatively larger, heavier, and more costly.

Many prior known systems for cooling avionics equipment use heat pipes. The heat pipe is a sealed thermodynamic system relaying on internal evaporation and condensation cycles. It comprises an enclosure, a wicking material lining the internal walls of the enclosure, and a working fluid for saturating the wick. One end of the heat pipe is called the evaporator and serves to absorb heat energy. Vapor formed in an evaporator is transported to the other end of the heat pipe, called the condenser, and the heat energy is released. The liquid is returned to the evaporator through a wick structure on the inside of the heat pipe completing the process. The performance of this heat pipe is highly dependent on the operating temperature, wick dryout, and internal generation of non-condensable gases. Therefore, heat pipe technology has limited ability beyond cooling low-power electronic components.

Spray cooling can be used to cool high heat dissipation electronic components. Generally, spray cooling performs at greater heat extraction levels than other techniques. In a spray cooling system, liquid from a reservoir is pumped into the spray module. The fluid is sprayed onto the area to be cooled. The heat vaporizes the fluid, thereby absorbing or removing part of the heat. The excess liquid and vapor are drawn through a condenser using pumps. The pumps return the cooled fluid to the reservoir for recirculation. However, during the operation of the spray cooling system, non-condensable gases can be released from either the fluid or the materials of construction. These non-condensable gases degrade condenser performance by displacing the working vapors and by impeding the vapor contact with the condenser surface. Therefore, the generation of non-condensable gases undermines the heat extraction efficiency of both heat pipes and spray cooling modules.

SUMMARY OF THE INVENTION

In one embodiment of the present invention, a multi-mode, two-phase cooling module for electronic components comprises three portions: a first housing portion, a second housing portion, and a third housing portion.

Cooling liquid is held in a cavity of the first housing or reservoir portion. One or more electronic components are mounted onto an external surface of the first housing portion. These electronic components could be low- to moderate-power electronic components.

The second housing or evaporator portion has one or more spray nozzles secured on the internal surfaces. One or more high-power electronic components are mounted onto one of its external surfaces in positions opposite to the spray nozzles.

The third housing or condenser portion has at least one condenser on an internal surface, and at least one heat sink on an external surface.

According to another embodiment of the present invention, the foregoing cooling module contains an electric fan, a piezo-electronic fan, or a spray nozzle for avoiding the collection of non-condensable gases near the internal surfaces of the condensers and for adding turbulence to the non-condensable gases and cooling liquid vapor to induce mixing of them.

DETAILED DESCRIPTION

Figure 1:
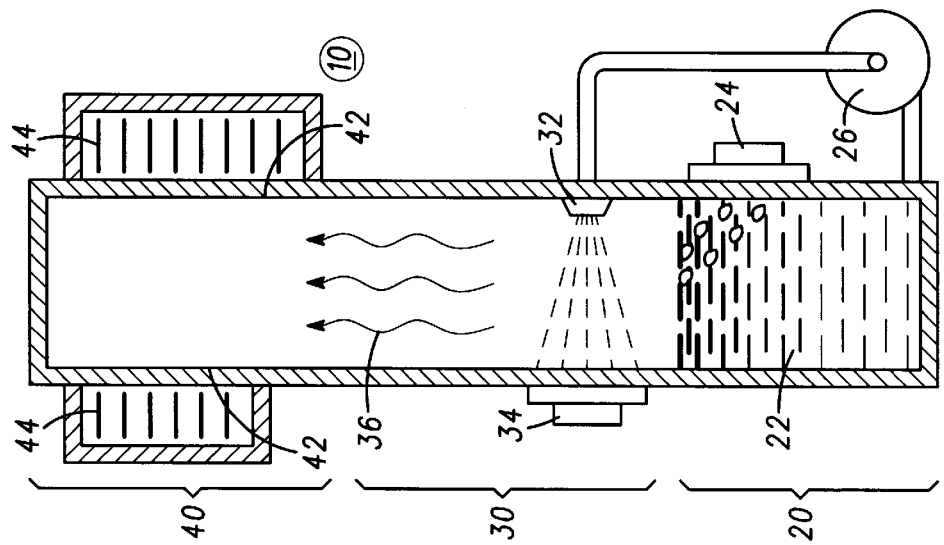
FIG. 1 is a sectional view of a multi mode, two-phase cooling module according to one embodiment of the present invention.

Referring to FIG. 1, in one embodiment, a multi-mode, two-phase cooling module, generally designated 10, for cooling electronic components according to the present invention comprises: a first housing portion 20, a second housing portion 30, and a third housing portion 40.

The first housing portion 20 acts as a liquid reservoir for holding cooling liquid 22. Cooling liquid 22 is selected from water, alcohol, perfluorinated dielectric liquid, or other phase-change liquid. One or more low-power electronic components 24 are mounted onto an external surface of lower section 20. Electronic components 24 are cooled by pool boiling of the liquid 22. Although, for the illustrative purpose, only one electronic component 24 is shown in FIG. 1, the number of electronic components is not limited to one.

The second housing portion 30 also retains a fluid, which is preferably air, and also retains the cooling liquid 22 which is in vapor state 36. The second housing portion 30 has a flow inducer, such as a spray nozzle 32, disposed therein. The flow inducer mixes the air and the cooling vapor 36, so that the cooling vapor 36 changes from a vapor back to a liquid and returns to the first housing portion 20.

The second housing portion 30 has one or more spray nozzles 32 secured onto its internal surfaces. One or more high-power electronic components 34 are mounted onto one of the external surfaces of cooling module 10 in a position opposite to one of the spray nozzles 32. The spray nozzles 32 are in fluid communication with cooling liquid 22 in the first housing portion 20. Cooling liquid 22 is supplied to the spray nozzles 32 via a pump 26. Upon contact with a heated portion of second housing portion 30, a portion of cooling liquid 22 is converted into vapor 36. The remaining portion of cooling liquid 22 remains in the liquid state and flows back to first housing portion 20. Cooling vapor 36 rises through second housing portion 30 into a third housing portion 40. Although, for the illustrative purpose, only one spray nozzle 32 and one high-power electronic component 34 are shown in FIG. 1, the number of spray nozzles 32 or high-power electronic components 34 is not limited to only one.

Third housing portion 40 comprises one or more condensing surfaces 42 on the internal surfaces, and one or more heat sinks 44 on the external surfaces. Cooling vapor 36 is condensed at condensing surfaces 42. The heat is removed outside of the cooling module 10 by the heat exchange between condensers 42 and heat sinks 44. Heat sinks 44 may be fins, or the like.

In this embodiment, the cooling module 10 is a brazed and/or welded metal assembly allowing multiple electronic components to be mounted onto external surfaces of the assembly. The metal material from which cooling module 10 is made consists of copper, stainless steel, aluminum, or the like. Since the material of cooling module 10 is metallic, the invention can also be used as a ground reference for electronic components 24 and 34.

Figure 2:
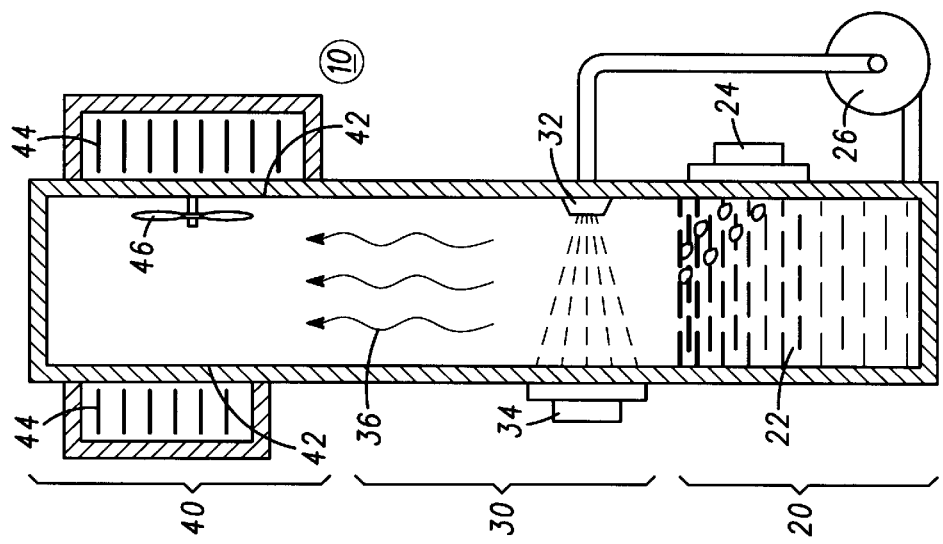
FIG. 2 is a sectional view of a multi mode, two-phase cooling module according to another embodiment of the present invention.
Figure 3:
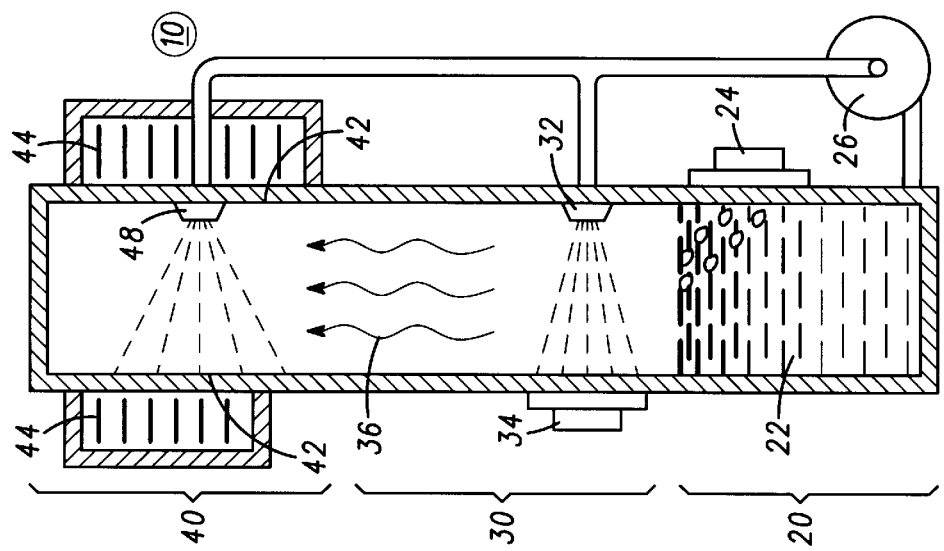
FIG. 3 is a sectional view of a multi mode, two-phase cooling module according to a further another embodiment of the present invention.

Referring to FIG. 2, a multi-mode, two-phase cooling module, generally designated 10, for cooling electronic components according to the present invention is illustrated. In this embodiment, the structures of first housing portion 20 and second housing portion 30 are the same as in the foregoing embodiment of the present invention. However, the third housing portion 40 includes a flow inducer near the internal surface of the condensers 42. Although the flow inducer of this embodiment in FIG. 2 is shown as an electric fan 46, flow inducer may be other than an electronic fan, such as a piezo-electric fan, a spray nozzle, or any other device operable to induce a flow in a particular medium or combination of media. A spray nozzle 48 for flow inducing purposes is shown in FIG. 3. The spray nozzle 48 could be the same as spray nozzles 32 used in the second housing portion 30. The position of the flow inducers is not limited to the position shown in FIG. 2 and FIG. 3. The flow inducers could be anywhere inside the third housing portion 40 of cooling module 10, as long as they are able to induce turbulence to the non-condensable gases and cooling liquid vapor.

When electronic components 24 are cooled by pool boiling or electronic components 34 are spray cooled, cooling liquid vapor is generated and non-condensable gases are potentially released. These cooling liquid vapors and non-condensable gases rise to the third housing portion 40 of cooling module 10, and tend to collect on the internal surfaces of condensers 42. This collection impacts the heat extraction efficiency of condensers 42. Furthermore, because of the existence of non-condensable gases and cooling liquid vapor, the pressure inside cooling module 10 is increased, in turn the vaporization point of cooling liquid 22 increases and the phase-change cooling efficiency of the two-phase cooling module 10 of the present invention will be lowered.

In the second embodiment, the function of flow inducers such as the the piezo-electric fan, the electric fan, or the spray nozzle is to add turbulence to the non-condensable gases and the cooling liquid vapor to induce mixing, and to move the prior existing cooling liquid 22 off the internal surfaces of the third portion 40 of the cooling module 10. Therefore, the heat exchange efficiency of the cooling module 10 of this embodiment is enhanced.

It will be appreciated that the number of flow inducers 46 or 48 is not limited, neither is the direction of each flow inducer 46 or 48, as long as they can induce effective turbulence, thus causing effective mixing of non-condensable gases and cooling liquid vapor.

While pumps 26 shown in FIGS. 1, 2, and 3 are installed outside the multi-mode, two-phase cooling module 10, they could be installed internally.

Furthermore, in stead of the condensing surfaces 42, fins or irregular surfaces could be used as the condensers in the third housing portion 40.

Although the invention has been shown and described with respect to exemplary embodiments thereof, various other changes in form and detail thereof may be made therein without departing from the spirit and scope of the invention.

What is claimed is:

1. A multi-mode, two-phase cooling module for electronic components, said multi-mode two-phase cooling module comprising:

a first housing portion forming a cavity for holding cooling fluid, said first housing portion sized to have a first electronic component mounted onto an external surface of said first housing portion;

a second housing portion having a spray nozzle coupled to a first inner surface for directing a spray of the cooling fluid, when the cooling fluid is present in the cavity, at a second inner surface of a first section of said second housing portion, the second housing portion sized to have a second electronic component mounted on an external surface thereof; and a third housing portion having an inner surface for condensing a cooling vapor, the inner surface of the third housing portion having one of a fan and a spray nozzle attached thereto, the one of the fan and the spray nozzle located to induce turbulence to non-condensable gases in the third housing portion.

2. The multi-mode, two-phase cooling module of claim 1, wherein said third housing portion comprises a heat sink on an external surface.

3. The multi-mode, two-phase cooling module of claim 1, wherein said first, second, and third housing portions comprises a thermally conductive material.

4. The multi-mode, two-phase cooling module of claim 3, wherein said thermally conductive material is selected from the group consisting of copper, stainless steel, and aluminum.

5. The multi-mode, two-phase cooling module of claim 1, wherein said cooling fluid is supplied to said spray nozzle via a pump.

6. The multi-mode, two-phase cooling module of claim 1, wherein said cooling fluid is a phase-change liquid.

7. The multi-mode, two-phase cooling module of claim 1, wherein said cooling fluid is selected from the group consisting of water, alcohol, and perfluorinated dielectric liquid.

8. A multi-mode, two-phase cooling module for cooling electronic components, said multi-mode, two-phase cooling module comprising:

a first housing portion forming a cavity for holding cooling fluid, said first housing portion sized to have a first electronic component mounted onto an external surface of said first housing portion;

a second housing portion having a spray nozzle coupled to a first inner surface for directing a spray of the cooling fluid, when the cooling fluid is present in the cavity, at a second inner surface of a first section of said second housing portion, the second housing portion sized to have a second electronic component mounted onto an external surface thereof;

a third housing portion having an inner surface for condensing a cooling vapor back to the cooling fluid;

a heat sink mounted to an external surface of said third housing portion; and one of a spray nozzle and a fan mounted on a portion of said inner surface of said third housing portion, the one of the fan and the spray nozzle located to induce turbulence to non-condensable gases in the third housing portion.

9. The multi-mode, two-phase cooling module of claim 8, wherein said first, second, and third housing portions are made of thermally conductive material.

10. The multi-mode, two-phase cooling module of claim 9, wherein said thermally conductive material is selected from the group consisting of copper, stainless steel, and aluminum.

11. The multi-mode, two-phase cooling module of claim 8, wherein said cooling fluid is supplied to said spray nozzle via a pump.

12. The multi-mode, two-phase cooling module of claim 8, wherein said cooling fluid is a phase-change liquid.

13. The multi-mode, two-phase cooling module of claim 8, wherein said cooling fluid is selected from the group consisting of water, alcohol, and perfluorinated dielectric liquid.

* * * * *